United States Patent
Lee et al.

(10) Patent No.: US 9,281,124 B2
(45) Date of Patent: Mar. 8, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Min Gon Lee, Suwon-Si (KR); Jong Han Kim, Suwon-Si (KR); Seung Ho Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 132 days.

(21) Appl. No.: 14/262,162

(22) Filed: Apr. 25, 2014

(65) Prior Publication Data
US 2015/0200054 A1     Jul. 16, 2015

(30) Foreign Application Priority Data
Jan. 10, 2014   (KR) .................... 10-2014-0003349

(51) Int. Cl.
*H01G 4/12*     (2006.01)
*H01G 4/30*     (2006.01)
*H01G 4/012*    (2006.01)
*H05K 1/18*     (2006.01)
*H05K 3/34*     (2006.01)

(52) U.S. Cl.
CPC ............. *H01G 4/12* (2013.01); *H01G 4/012* (2013.01); *H01G 4/30* (2013.01); *H05K 3/3442* (2013.01); *H05K 2201/10015* (2013.01); *H05K 2201/2045* (2013.01); *Y10T 29/435* (2015.01)

(58) Field of Classification Search
CPC ........... H01G 4/12; H01G 4/30; H01G 4/012; H05K 1/181; H05K 2201/10015
USPC ............. 174/258; 29/25.42; 361/301.4, 321.1
See application file for complete search history.

(56) References Cited

U.S. PATENT DOCUMENTS

| | | | | |
|---|---|---|---|---|
| 7,715,171 B2 * | 5/2010 | Nakano | ............. | H01G 4/012 361/303 |
| 8,315,037 B2 * | 11/2012 | Nakamura | ............. | C04B 35/03 361/321.4 |
| 8,383,535 B2 * | 2/2013 | Yamaguchi | ............. | C04B 35/46 361/321.4 |
| 2007/0025055 A1 * | 2/2007 | Mizuno | ............. | H01G 4/005 361/303 |

FOREIGN PATENT DOCUMENTS

| | | | |
|---|---|---|---|
| JP | 6-215978 A | 8/1994 | |
| JP | 2007-035850 A | 2/2007 | |
| KR | 20140121727 | * 10/2014 | ............. H01G 4/012 |

* cited by examiner

*Primary Examiner* — Timothy Thompson
*Assistant Examiner* — Charles Pizzuto
(74) *Attorney, Agent, or Firm* — McDermott Will & Emery LLP (57) ABSTRACT

A multilayer ceramic capacitor may include a ceramic body having a plurality of dielectric layers stacked therein; an active part including a plurality of first and second internal electrodes alternately exposed through both end surfaces of the ceramic body; upper and lower cover layers; and first and second external electrodes covering both end surfaces of the ceramic body. When a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the internal electrodes are overlapped in a thickness direction, is defined as Aa, $1.826 \leq C/M \leq 4.686$, and $0.2142 \leq Aa/Ac \leq 0.4911$.

19 Claims, 6 Drawing Sheets

MULTILAYER CERAMIC CAPACITOR AND BOARD HAVING THE SAME MOUNTED THEREON

CROSS-REFERENCE TO RELATED APPLICATION

This application claims the benefit of priority to Korean Patent Application No. 10-2014-0003349 filed on Jan. 10, 2014, with the Korean Intellectual Property Office, the disclosure of which is incorporated herein by reference.

BACKGROUND

The present disclosure relates to a multilayer ceramic capacitor and a board having the same mounted thereon.

A multilayer ceramic capacitor, or a multilayer chip electronic component, may be a chip-shaped condenser, which is mounted on boards of various electronic products such as display devices, liquid crystal displays (LCDs), plasma display panels (PDPs) and the like, for example, as well as computers, personal digital assistants (PDA), mobile phones, and the like, to serve to charge or discharge electricity therein or therefrom.

Since such a multilayer ceramic capacitor (MLCC) has advantages such as a small size, a high capacitance, ease of mounting, or the like, such a multilayer ceramic capacitor may be used as a component in various electronic devices.

The multilayer ceramic capacitor may include a plurality of dielectric layers and internal electrodes alternately stacked between the dielectric layers and having different polarities.

Since the dielectric layer has piezoelectric and electrostrictive properties, a piezoelectric phenomenon occurs between the internal electrodes due to vibrations generated when a direct current (DC) or alternating current (AC) voltage is applied to the multilayer ceramic capacitor.

These vibrations may be transferred to a board on which the multilayer ceramic capacitor is mounted through external electrodes of the multilayer ceramic capacitor, so that the entirety of the board serves as a sound radiating surface to generate a vibration sound, noise.

The vibration sound may be within an audio frequency range of 20 to 20,000 Hz, which may cause listener discomfort and is referred to as an acoustic noise.

Recently, a degree of the acoustic noise has become an important factor in determining quality of the multilayer ceramic capacitor.

In accordance with an increase in capacitance of the multilayer ceramic capacitor, a mechanical deformation amount of dielectrics may be inevitably increased. Therefore, various methods for solving this problem have been attempted.

One of the methods is to control an acoustic noise by controlling an amount of solder used to bond the multilayer ceramic capacitor to the board.

However, in this method, bonding strength between the board and the multilayer ceramic capacitor is decreased in proportion to an amount of the solder. Thus, it is difficult to expect a large decrease in the acoustic noise even in a case in which an amount of the solder is decreased.

Another method is changing an internal structure of the multilayer ceramic capacitor.

However, the method of changing an internal structure of the multilayer ceramic capacitor generally requires a size or a form of a product to be mainly changed. Thus, an additional appropriate method of mounting the multilayer ceramic capacitor needs to be introduced.

Still another method is controlling a direction in which the multilayer ceramic capacitor is mounted.

However, the method of controlling a direction in which the multilayer ceramic capacitor is mounted requires a separate process to separately align the direction in which the multilayer ceramic capacitor is mounted.

SUMMARY

An aspect of the present disclosure may provide a multilayer ceramic capacitor capable of being manufactured in a general standard form and significantly decreasing an acoustic noise, regardless of cases in which it is mounted on a board to be parallel or perpendicular thereto, and a board having the same mounted thereon.

According to an aspect of the present disclosure, a multilayer ceramic capacitor may include: a ceramic body having a plurality of dielectric layers stacked therein; an active part including a plurality of first and second internal electrodes alternately exposed through both end surfaces of the ceramic body, respectively, each of the dielectric layers being interposed between the plurality of first and second internal electrodes; upper and lower cover layers disposed on upper and lower surfaces of the active part, respectively; and first and second external electrodes covering the both end surfaces of the ceramic body respectively. When a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

The multilayer ceramic capacitor may have a capacitance of 10 μF or more.

A difference between a width and a thickness of the ceramic body may be 15% or less.

A thickness of the dielectric layer may be 0.9 to 1.75 μm.

The margin between the active part and the side surface of ceramic body in the width direction may be 90 μm or more.

According to another aspect of the present disclosure, a board; first and second electrode pads disposed on the substrate; and a multilayer ceramic capacitor mounted on the first and second electrode pads. The multilayer ceramic capacitor includes: a ceramic body having a plurality of dielectric layers stacked therein; an active part including a plurality of first and second internal electrodes alternately exposed through both end surfaces of the ceramic body respectively, each of the dielectric layers being interposed between the plurality of first and second internal electrodes, and the plurality of first and second internal electrodes being disposed to be parallel with respect to a mounting surface of the substrate; upper and lower cover layers formed on upper and lower surfaces of the active part respectively; and first and second external electrodes covering the both end surfaces of the ceramic body respectively. When a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

According to another aspect of the present disclosure, a board may include: a substrate; first and second electrode pads disposed on the substrate; and a multilayer ceramic capacitor mounted on the first and second electrode pads. The multilayer ceramic capacitor includes: a ceramic body having a plurality of dielectric layers stacked therein; an active part including a plurality of first and second internal electrodes alternately exposed through both end surfaces of the ceramic body respectively, each of the dielectric layers being interposed between the plurality of first and second internal electrodes, and the plurality of first and second internal electrodes being disposed to be perpendicular with respect to a mounting surface of the substrate; upper and lower cover layers disposed on upper and lower surfaces of the active part respectively; and first and second external electrodes covering the both end surfaces of the ceramic body respectively. When a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a ceramic body will be defined in order to clearly describe exemplary embodiments of the present disclosure. L, W and T indicated in the accompanying drawings refer to a length direction, a width direction, and a thickness direction of the ceramic body, respectively.

Multilayer Ceramic Capacitor

Figure 1:
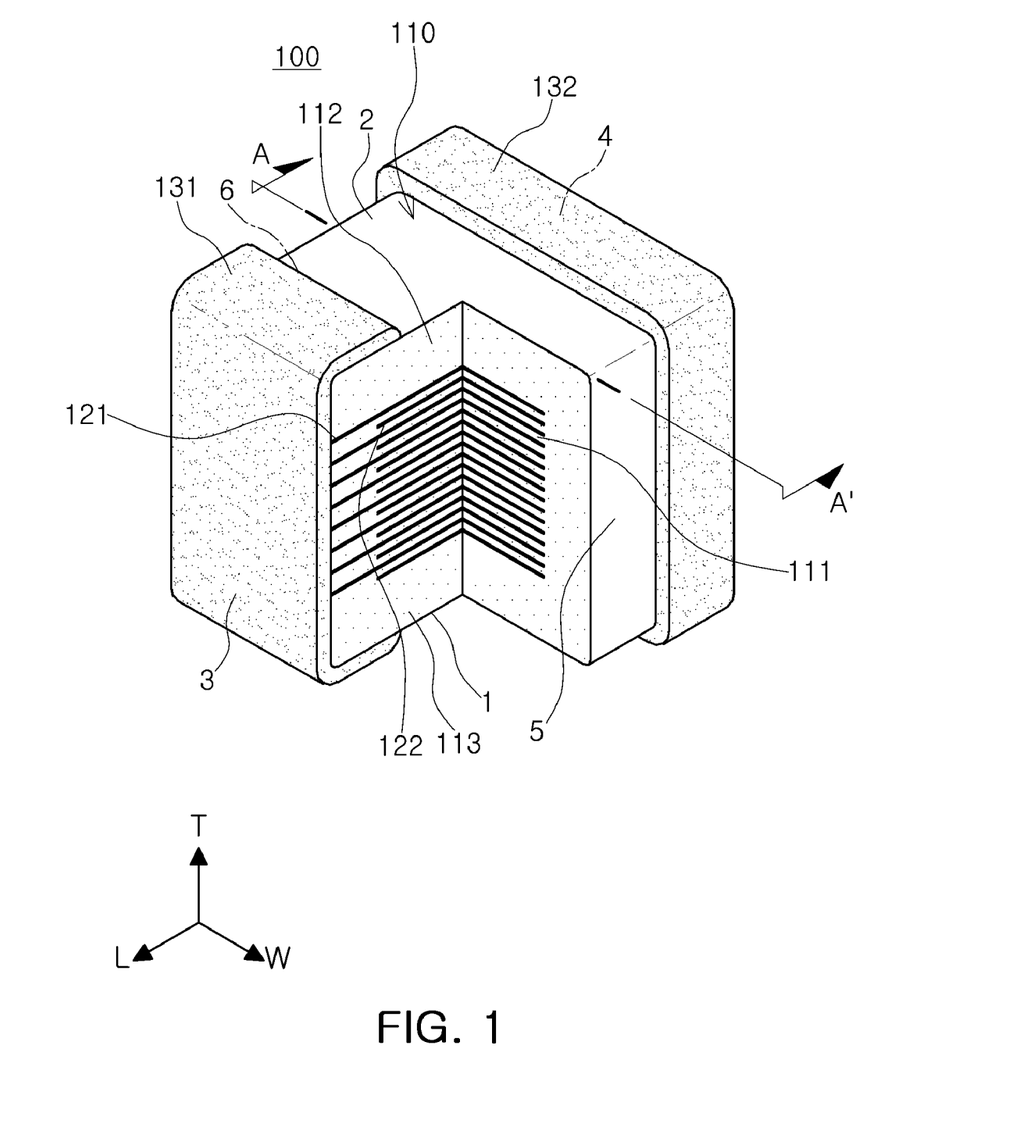
FIG. 1 is a partially cut-away perspective view schematically showing a multilayer ceramic capacitor according to an exemplary embodiment of the present disclosure.
Figure 2:
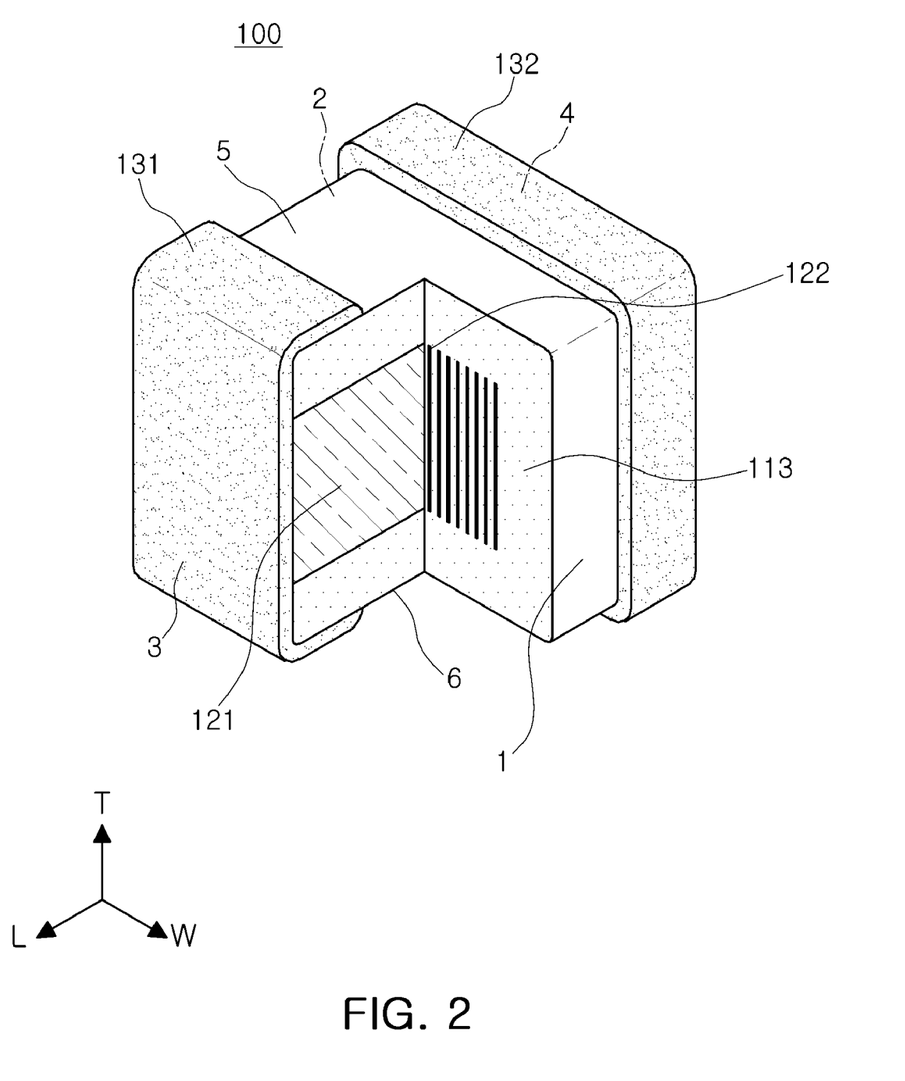
FIG. 2 is a partially cut-away perspective view schematically showing the multilayer ceramic capacitor of FIG. 1 after it is rotated in a vertical mounting direction.

FIG. 1 is a partially cut-away perspective view schematically illustrating a multilayer ceramic capacitor according to an exemplary embodiment of the present disclosure. FIG. 2 is a partially cut-away perspective view schematically showing the multilayer ceramic capacitor of FIG. 1 after it is rotated in a vertical mounting direction.

Referring to FIGS. 1 and 2, a multilayer ceramic capacitor 100 according to an exemplary embodiment of the present disclosure may include a ceramic body 110, an active part 115 including first and second internal electrodes 121 and 122, upper and lower cover layers 112 and 113, and first and second external electrodes 131 and 132.

The ceramic body 110 may be formed by stacking a plurality of dielectric layers 111 and then sintering the same. A shape and a dimension of the ceramic body 110 and the number of stacked dielectric layers 111 are not limited to those of examples shown in FIGS. 1 and 3.

Here, a difference in a length and a width of the ceramic body 110 may be preferably 15% or less. However, the present disclosure is not limited thereto.

Further, the plurality of dielectric layers 111 forming the ceramic body 110 may be in a sintered state and may be integrated such that a boundary between the dielectric layers 111 adjacent to each other are not readily apparent without a scanning electron microscope (SEM).

In addition, the ceramic body 110 may have a hexahedral shape.

In the present exemplary embodiment, for convenience of explanation, surfaces of the ceramic body 110 opposing each other in the thickness direction refer to first and second main surfaces 1 and 2, surfaces of the ceramic body 110 connecting the first and second main surface 1 and 2 and opposing each other in the length direction refer to first and second end surfaces 3 and 4, and surfaces of the ceramic body 110 connected to be perpendicular to the first and second end surfaces 3 and 4 and opposing each other in the width direction refer to first and second side surfaces 5 and 6.

The ceramic body 110 may include the active part 115 contributing to capacitance formation of the capacitor, and the upper and lower cover layers 112 and 113 formed as upper and lower margin parts on the active part 115, respectively.

The active part 115 may be formed by alternately stacking the plurality of first and second internal electrodes 121 and 122 with each of the dielectric layers 111 interposed therebetween, in a repeated manner.

The upper and lower cover layers 112 and 113 may be formed of the same material as the dielectric layers 111 of the active part 115 and may have the same configuration as that of the active part 115 except that they do not include the internal electrodes therein. However, the present disclosure is not limited thereto.

The upper and lower cover layers 112 and 113 may be formed by stacking a single dielectric layer or two or more dielectric layers on upper and lower surfaces of the active part 115 in the thickness direction, respectively, and may basically serve to prevent damage to the first and second internal electrodes 121 and 122 due to physical or chemical stress.

The dielectric layers 111 may contain a ceramic material having a high dielectric constant, for example, a barium titanate ($BaTiO_3$) based powder, a strontium titanate ($SrTiO_3$)

based powder, or the like. However, the present disclosure is not limited thereto as long as a sufficient capacitance may be obtained.

In addition, the dielectric layers 111 may further contain a ceramic additive, an organic solvent, a plasticizer, a binder, a dispersing agent, or the like, added thereto, if necessary, in addition to the ceramic powder.

Examples of the ceramic additive may include a transition metal oxide or carbide, rare earth elements, magnesium (Mg), aluminum (Al), and the like. However, the present disclosure is not limited thereto.

Here, a thickness of the dielectric layers 111 may be arbitrarily changed in accordance with a capacitance design of the multilayer ceramic capacitor 100, and a thickness of a single dielectric layer 111 may be 0.9 μm or more, preferably, 0.9 to 1.75 μm. However, the present disclosure is not limited thereto.

In a case in which the thickness of the single dielectric layer 111 is less than 0.9 μm, withstanding voltage characteristics may be deteriorated, and in a case in which the thickness of the single dielectric layer 111 exceeds 1.75 μm, a capacitance implementation rate may be lower than a reference value.

In the present exemplary embodiment, an interval between the internal electrodes adjacent to each other in a vertical direction is decreased compared with a multilayer ceramic capacitor according to the related art, whereby the same capacitance as that of the multilayer ceramic capacitor according to the related art may be achieved while the number of stacked internal electrodes is relatively smaller than that of stacked internal electrodes of the multilayer ceramic capacitor according to the related art, and the chip size is maintained as same as that of the multilayer ceramic capacitor according to the related art. Therefore, the upper and lower cover layers having a predetermined thickness may be secured, while a crack of the internal electrodes may be prevented and an acoustic noise may be decreased.

The first and second internal electrodes 121 and 122, electrodes having different polarities, may be formed by printing a conductive paste containing a conductive metal on one surfaces of the dielectric layers 111 at a predetermined thickness and may be alternately exposed through both end surfaces of the ceramic body 110 in a direction in which the dielectric layers 111 are stacked. The first and second internal electrodes 121 and 122 may be electrically insulated from each other with the dielectric layers 111 disposed therebetween.

The first and second internal electrodes 121 and 122 may be electrically connected to the first and second external electrodes 131 and 132 through portions thereof alternately exposed to both end surfaces of the ceramic body 110, respectively.

Therefore, when a voltage is applied to the first and second external electrodes 131 and 132, charges may be accumulated between the first and second internal electrodes 121 and 122 facing each other. In this case, a capacitance of the multilayer ceramic capacitor 100 may be proportional to an area where the first and second internal electrodes 121 and 122 are overlapped with each other in the active part 115.

Here, the first and second internal electrodes may be stacked such that the capacitance of the multilayer ceramic capacitor is 10 μF or more.

A thickness of the first or second internal electrode 121 or 122 may be determined depending on an intended use thereof. For example, the thickness of the first or second internal electrode 121 or 122 may be determined to be in a range of 0.2 to 1.0 μm in consideration of a size of the ceramic body 110. However, the present disclosure is not limited thereto.

For example, in a case in which the thickness of the first or second internal electrode 121 or 122 is less than 0.2 μm, electrode connectivity and withstanding voltage characteristics may be deteriorated, and in a case in which the thickness of the first or second internal electrode 121 or 122 exceeds 1.0 μm, delamination may be intensified due to steps performed between the margin parts and the active part 115.

In addition, the conductive metal contained in the conductive paste for forming the first and second internal electrodes 121 and 122 may be nickel (Ni), copper (Cu), palladium (Pd), or an alloy thereof. However, the present disclosure is not limited thereto.

In addition, as a method of printing the conductive paste, a screen printing method, a gravure printing method, or the like, may be used. However, the present disclosure is not limited thereto.

The first and second external electrodes 131 and 132 may cover the first and second end surfaces 3 and 4 of the ceramic body 110, respectively.

That is, the first and second external electrodes 131 and 132 may extend from the first and second end surfaces 3 and 4 of the ceramic body 110 to portions of the first and second main surfaces 1 and 2 and portions of the first and second side surfaces 5 and 6 thereof, respectively.

The first and second external electrodes 131 and 132 may be formed of a conductive paste containing a conductive metal.

The conductive metal may be nickel (Ni), copper (Cu), palladium (Pd), gold (Au), or an alloy thereof. However, the present disclosure is not limited thereto.

Here, electrical features and an acoustic noise of the multilayer ceramic capacitor according to the present exemplary embodiment depending on dimensions of components included in the multilayer ceramic capacitor will be described.

Figure 3:
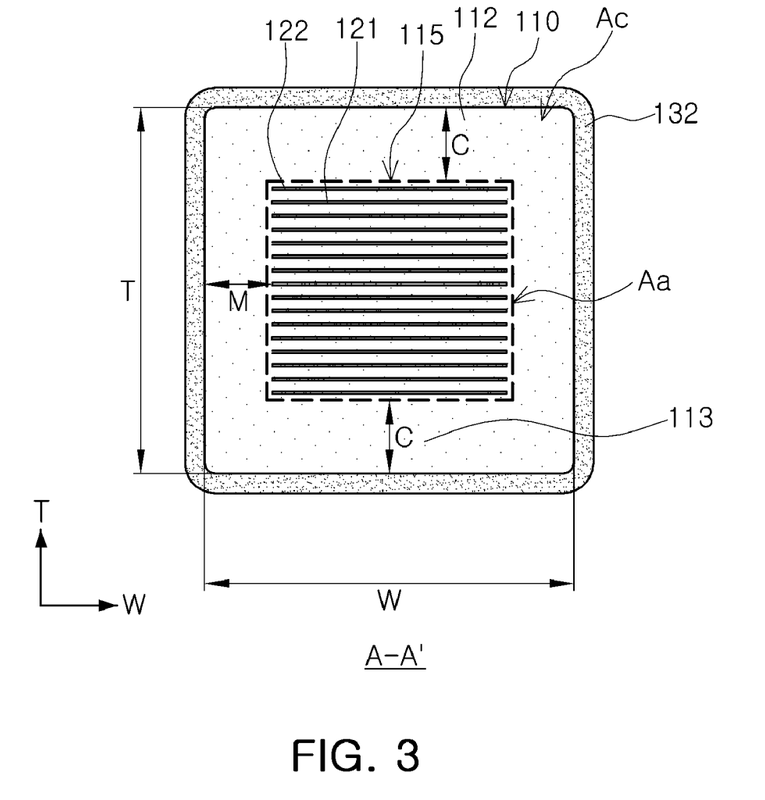
FIG. 3 is a cross-sectional view taken along line A-A' of FIG. 1.

FIG. 3 is a schematic cross-sectional view taken along line A-A' of the multilayer ceramic capacitor of FIG. 1 in order to describe a dimension relationship between components included in the multilayer ceramic capacitor.

In FIG. 3, a thickness of each of the upper and lower cover layers 112 and 113 is defined as C, a margin of the ceramic body 110 in the width direction is defined as M, a cross-sectional area of the ceramic body 110 in a width-thickness direction is defined as Ac, and a cross-sectional area of the active part 115 in the width-thickness direction is defined as Aa.

Here, the margin M of the ceramic body 110 in the width direction refers to a distance from an edge of the active part 115 in which the first and second internal electrodes 121 and 122 are overlapped with each other to one side surface of the ceramic body 110.

In a multilayer ceramic capacitor according to the related art, an acoustic noise is generated in an active part due to piezoelectric properties of a dielectric material when power is applied to the multilayer ceramic capacitor. Particularly, in a high capacitance multilayer ceramic capacitor, the piezoelectric properties are increased, such that the acoustic noise may be significantly increased.

Since the acoustic noise is mainly caused by strain generated in a direction in which an electric field is applied, the margin parts provided on upper and lower portions of the active part may be enlarged, such that the acoustic noise may be decreased.

In addition, magnitudes of an acoustic noise vary depending on whether the multilayer ceramic capacitor is mounted on a board to be parallel or perpendicular thereto. Thus, the multilayer ceramic capacitor needs to be mounted while a mounting direction in which it is mounted with respect to the board is confirmed. In addition, in a case in which the mounting direction is erroneous, an acoustic noise may be increased as compared with the case of a design.

According to the present exemplary embodiment, when $1.826 \leq C/M \leq 4.686$ and $0.2142 \leq Aa/Ac \leq 0.4911$ are satisfied, a difference between an acoustic noise generated in a case in which the multilayer ceramic capacitor is mounted on a board to be parallel thereto and an acoustic noise generated in a case in which the multilayer ceramic capacitor is mounted on a board to be perpendicular thereto may be significantly decreased. That is, a value of the acoustic noise generated in the case in which the multilayer ceramic capacitor is mounted on a board to be perpendicular thereto may become similar to a value of the acoustic noise generated in the case in which the multilayer ceramic capacitor is mounted on a board to be parallel thereto.

When C/M is less than 1.826, a decrease effect of the acoustic noise may not be present, and a level of the acoustic noise generated in the case in which the multilayer ceramic capacitor is mounted on a board to be parallel thereto may be greater than that of the acoustic noise generated in the case in which the multilayer ceramic capacitor is mounted on a board to be perpendicular thereto.

In addition, when C/M exceeds 4.686, that is the margin part of the dielectric layers is excessively small, the probability that a cutting defect is generated during a process of cutting a multilayer body into individual chips may be increased.

Further, when Aa/Ac is less than 0.2142, the capacitance of the capacitor may be smaller than a required design value. When Aa/Ac exceeds 0.4911, a ratio between the acoustic noise generated in the case in which the multilayer ceramic capacitor is mounted on a board to be parallel thereto and the acoustic noise generated in the case in which the multilayer ceramic capacitor is mounted on a board to be perpendicular thereto may exceed 1.1. Thus, different levels of acoustic noise may be generated in both cases.

Therefore, when a multilayer ceramic capacitor satisfy the ranges of $1.826 \leq C/M \leq 4.686$ and $0.2142 \leq Aa/Ac \leq 0.4911$, it may be unnecessary to determine the mounting direction in which a chip is mounted with respect to a board while a capacitance of the chip may be secured, thereby preventing the multilayer ceramic capacitor from being mounted on a board in an inappropriate direction to generate a significant acoustic noise as well as preventing the cutting defect from being generated in the process of cutting the multilayer body into individual chips.

Board Having Multilayer Ceramic Capacitor Mounted Thereon

Figure 4:
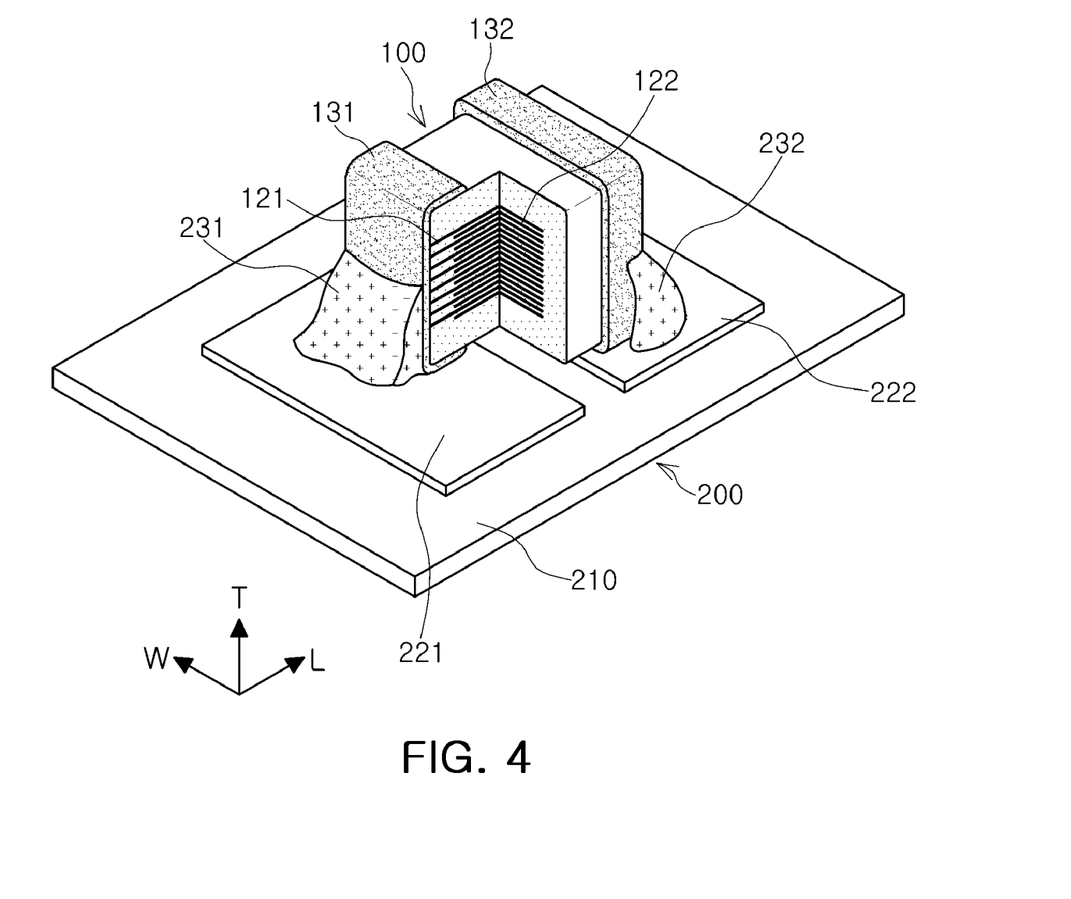
FIG. 4 is a perspective view showing a state in which the multilayer ceramic capacitor of FIG. 1 is mounted on a board.
Figure 5:
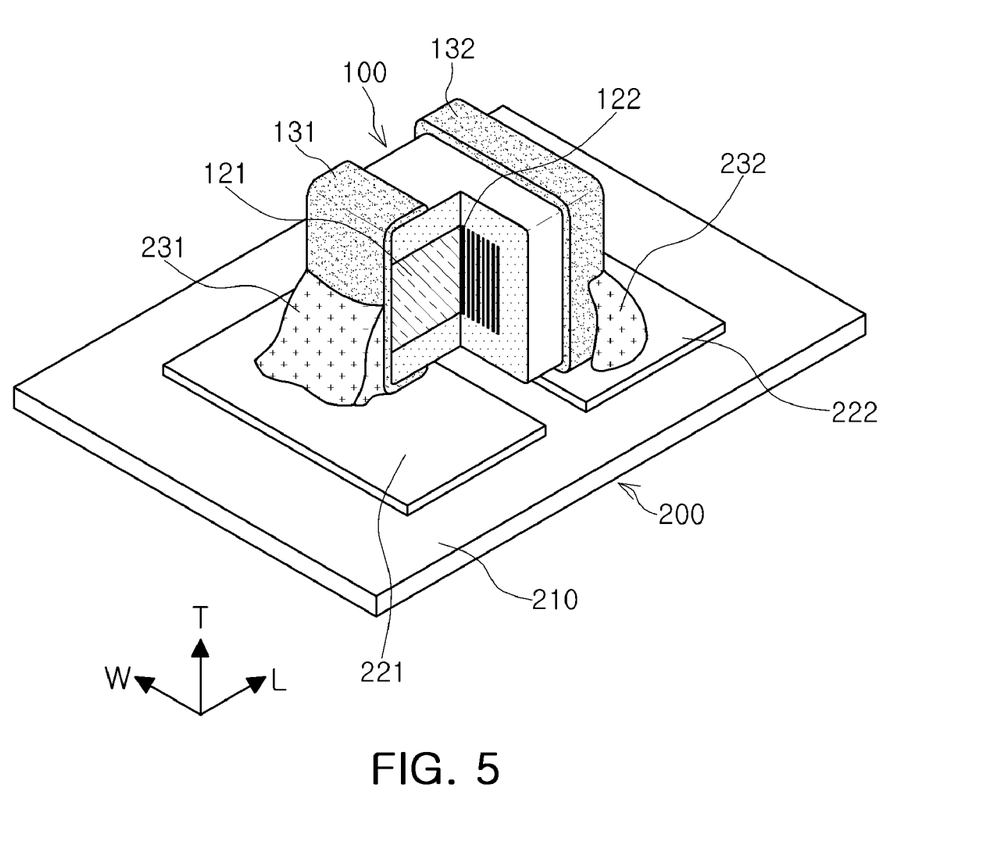
FIG. 5 is a cross-sectional view showing a state in which the multilayer ceramic capacitor of FIG. 2 is mounted on a board.

FIG. 4 is a perspective view showing a state in which the multilayer ceramic capacitor of FIG. 1 is mounted on a board. FIG. 5 is a cross-sectional view showing a state in which the multilayer ceramic capacitor of FIG. 2 is mounted on a board.

Referring to FIGS. 4 and 5, a board 200 having the multilayer ceramic capacitor 100 mounted thereon according to the present exemplary embodiment may include a substrate 210 having the first and second internal electrodes 121 and 122 of the multilayer ceramic capacitor 100 mounted thereon to be parallel or perpendicular with respect to a mounting surface of the substrate and first and second electrode pads 221 and 222 formed on an upper surface of the substrate 210 to be spaced apart from each other.

Here, the multilayer ceramic capacitor 100 may be electrically connected to the substrate 210 with soldering parts 231 and 232 in a state in which the lower cover layer 113 thereof is disposed toward the substrate 210 and the first and second external electrodes 131 and 132 are positioned on the first and second electrode pads 221 and 222, respectively, to come into contact therewith, respectively.

When a voltage is applied to the multilayer ceramic capacitor 100 in a state in which the multilayered ceramic capacitor 100 is mounted on the substrate 210, an acoustic noise may be generated.

Here, sizes of the first and second electrode pads 221 and 222 may determine an amount of the soldering parts 231 and 232 connecting the first and second external electrodes 131 and 132 of the multilayer ceramic capacitor 100 and the first and second electrode pads 221 and 222, respectively, and a magnitude of the acoustic noise may be adjusted according to the amount of the soldering parts 231 and 232. However, the present disclosure is not limited thereto.

Generally, the reason why an acoustic noise is generated in the multilayer ceramic capacitor 100 is that when an electric field is applied to the multilayer ceramic capacitor 100, physical deformation of a dielectric material to which the electric field is applied occurs in the active part of the multilayer ceramic capacitor 100 due to inverse piezoelectric properties of the dielectric layers 111 to thereby generate the displacement of a surface of the multilayer ceramic capacitor 100.

Here, the displacement occurring in the surface of the multilayer ceramic capacitor 100 may be caused by the deformation of the upper or lower cover layer 112 or 113 due to a force resulting from deformation of the dielectric layers 111.

That is, the upper or lower cover layer 112 or 113 may be bent, and an amount of deformation of the upper or lower cover layer 112 or 113 may be proportional to (a length of the upper or lower cover layer/a thickness of the upper or lower cover layer)$^3$.

Therefore, since the multilayer ceramic capacitor 100 has a standard size, the thickness of the upper or lower cover layer 112 or 113 may be increased in order to decrease an amount of deformation of the multilayer ceramic capacitor 100 and decrease an acoustic noise.

Meanwhile, the deformation of the dielectric layers 111 due to the electric field may cause deformation of the multilayer ceramic capacitor 100 in the width direction as well as the deformation thereof in the thickness direction by a Poisson effect.

Here, an amount of deformation generated in the multilayer ceramic capacitor 100 may be proportional to (the length T of the ceramic body/the margin M of the ceramic body in width direction)$^3$.

Since displacement of the multilayer ceramic capacitor 100 in the thickness direction is greater than displacement thereof in the width direction, an acoustic noise may be further decreased in a vertical mounting type scheme in which the capacitor is mounted on a board to be perpendicular with respect thereto, rather than in a horizontal mounting type scheme in which the capacitor is mounted on a board to be parallel with respect thereto.

Figure 6:
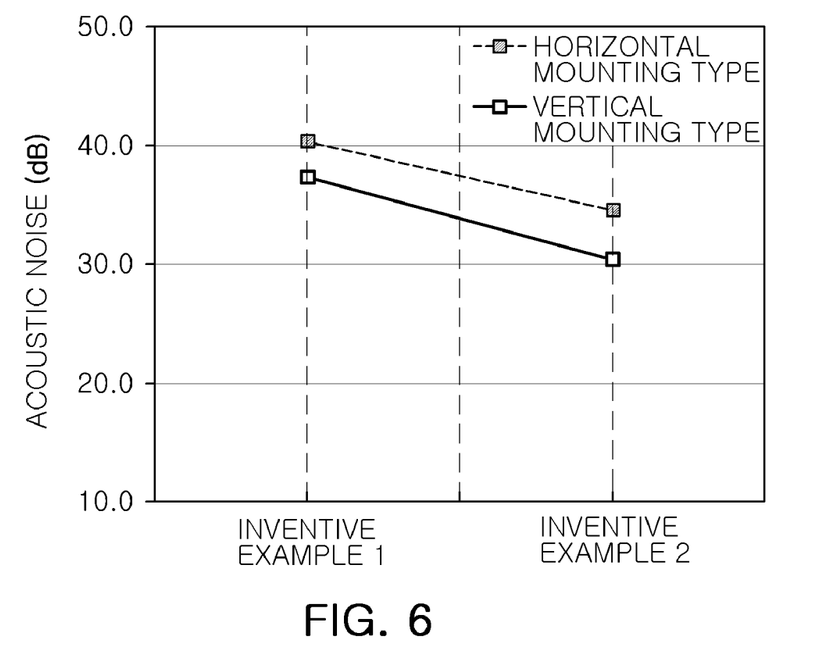
FIG. 6 is a graph showing comparison results obtained by measuring acoustic noises in the boards of FIGS. 4 and 5.

FIG. 6 is a graph showing comparison results obtained by measuring acoustic noises in the boards of FIGS. 4 and 5.

Referring to FIG. 6, it could be appreciated that in the case of Example 1 in which length×width of the multilayer ceramic capacitor is 1.6×0.8 mm, an acoustic noise in the vertical mounting type scheme is about 38 dB and an acoustic noise in the horizontal mounting type scheme is about 40 dB.

In addition, it could be appreciated that in the case of Example 2 in which length×width of the multilayer ceramic capacitor was 1.0×0.5 mm, an acoustic noise in the vertical mounting type scheme is about 30 dB and a level of an acoustic noise in the horizontal mounting type scheme is about 35 dB.

Therefore, in order to implement similar levels of acoustic noise regardless of mounting directions in which the capacitor is mounted with respect to a board, the thicknesses of the upper and lower cover layers need to be larger than those of upper and lower cover layers of a general multilayer ceramic capacitor. However, in a case in which the thicknesses of the upper and lower cover layers are excessively large, the displacement of the multilayer ceramic capacitor in the width direction may be greater than the displacement thereof in the thickness direction. Therefore, it may be appreciated that the thicknesses of the upper and lower cover layers need to be in an appropriate range.

Experimental Example

Multilayer ceramic capacitors according to Inventive Examples and Comparative Examples are manufactured as follows.

A slurry containing a powder such as a barium titanate powder, or the like, is applied to carrier films and dried thereon to prepare a plurality of ceramic green sheets.

Next, a conductive paste is applied to the ceramic green sheets using a screen printing method, or the like, to form first and second internal electrodes to be alternately exposed through both end surfaces of the ceramic green sheets.

The plurality of ceramic green sheets were stacked such that the first and second internal electrodes are alternately disposed, thereby forming a multilayer body.

Then, the ceramic green sheets on which the first and second internal electrodes are not formed are stacked on upper and lower surfaces of the multilayer body, respectively, to form upper and lower cover layers.

Next, the multilayer body having the upper and lower cover layers formed thereon is subject to isostatic pressing under pressure conditions of about 1,000 kg·f/cm² at a temperature of about 85° C.

Thereafter, the multilayer body on which the pressing has been completed is cut into individual chips, and the cut chip is maintained at a temperature of about 230° C. for about 60 hours under the air atmosphere and then, is subject to a debinder process.

Next, the chip is sintered at a temperature of about 1200° C. under a reducing atmosphere having oxygen partial pressure of $10^{-11}$ to $10^{-10}$ atm lower than a Ni/NiO balanced oxygen partial pressure in such a manner that the first and second internal electrodes are not oxidized, thereby preparing a ceramic body.

Here, the conditions of the above-mentioned manufacturing processes are merely provided by way of example, and detailed conditions under which the multilayer ceramic capacitors according to Inventive Examples are manufactured may be changed.

Here, length×width×thickness (L×W×T) of the ceramic body 110 after being sintered are about 2.0 mm×1.2 mm×1.2 mm.

Next, a process of forming first and second external electrodes on first and second end surfaces of the ceramic body is performed to manufacture the multilayer ceramic capacitor.

Here, a manufacturing tolerance of length×width×thickness (L×W×T) of the multilayer ceramic capacitor is set to be in a range of ±0.1 mm, and in a case in which the manufacturing tolerance is in the range of ±0.1 mm, the multilayer ceramic capacitor is mounted on a board to be parallel or perpendicular thereto.

Multilayer ceramic capacitors used in the following experimentation had the same active region, and acoustic noises thereof are measured after only thicknesses of upper or lower cover layers and margins of ceramic bodies in a width direction are adjusted.

Here, since the acoustic noise has a value resulting from dielectric properties, all of dielectric capacitances of the multilayer ceramic capacitors used in the experimentation are adjusted to have a value of about 10 µF and were adjusted not to at least exceed 10.3 µF.

In the following Table 1, HN indicates an acoustic noise value in a case in which the multilayer ceramic capacitor is mounted on a board to be parallel with respect thereto, and VN indicates an acoustic noise value in a case in which the multilayer ceramic capacitor is mounted on the board to be perpendicular with respect thereto.

TABLE 1

| # | W(um) | T(um) | M(um) | C(um) | C/M | HN(dB) | VN(dB) | HN/VN | Whether or not Cutting Defect Has Occurred |
|---|---|---|---|---|---|---|---|---|---|
| 1 | 1118 | 1122 | 136 | 121 | 0.890 | 47.6 | 36.8 | 1.29 | OK |
| 2 | 1120 | 1137 | 138 | 138 | 1.000 | 46.7 | 36.7 | 1.27 | OK |
| 3 | 1124 | 1157 | 142 | 159 | 1.120 | 47.1 | 36.6 | 1.29 | OK |
| 4 | 1121 | 1175 | 143 | 177 | 1.238 | 46.4 | 35.3 | 1.31 | OK |
| 5 | 1120 | 1200 | 141 | 202 | 1.433 | 45.6 | 35.7 | 1.28 | OK |
| 6 | 1118 | 1216 | 140 | 221 | 1.579 | 42.3 | 36.1 | 1.17 | OK |
| 7 | 1122 | 1251 | 142 | 248 | 1.746 | 41.8 | 36.6 | 1.14 | OK |
| 8* | 1125 | 1198 | 143 | 297 | 2.077 | 36.9 | 37.6 | 0.98 | OK |
| 9 | 1101 | 1102 | 119 | 97 | 0.815 | 48.7 | 36.4 | 1.34 | OK |
| 10 | 1102 | 1121 | 122 | 121 | 0.992 | 47.2 | 37.1 | 1.27 | OK |
| 11 | 1101 | 1137 | 121 | 140 | 1.157 | 47.4 | 37.4 | 1.27 | OK |
| 12 | 1101 | 1158 | 118 | 158 | 1.339 | 45.9 | 37.2 | 1.23 | OK |
| 13 | 1096 | 1179 | 120 | 181 | 1.508 | 44.3 | 36.9 | 1.20 | OK |
| 14 | 1097 | 1199 | 124 | 202 | 1.629 | 42.7 | 37.5 | 1.14 | OK |
| 15* | 1103 | 1217 | 121 | 221 | 1.826 | 41.3 | 37.9 | 1.09 | OK |
| 16* | 1100 | 1251 | 123 | 247 | 2.008 | 39.6 | 37.6 | 1.05 | OK |
| 17* | 1100 | 1302 | 124 | 303 | 2.444 | 38.8 | 38.1 | 1.02 | OK |
| 18* | 1098 | 1302 | 122 | 348 | 2.852 | 38.4 | 37.8 | 1.02 | OK |
| 19* | 1099 | 1398 | 117 | 403 | 3.444 | 37.6 | 38.3 | 0.98 | OK |
| 20* | 1099 | 1451 | 116 | 447 | 3.853 | 36.7 | 38.6 | 0.95 | OK |
| 21* | 1103 | 1501 | 121 | 498 | 4.116 | 36.1 | 39.3 | 0.92 | OK |
| 22* | 1102 | 1552 | 118 | 553 | 4.686 | 35.2 | 38.6 | 0.91 | OK |
| 23 | 1101 | 1598 | 120 | 596 | 4.967 | 33.5 | 40.8 | 0.82 | OK |
| 24 | 1082 | 1120 | 102 | 121 | 1.186 | 46.7 | 38.2 | 1.22 | OK |
| 25 | 1081 | 1139 | 101 | 138 | 1.366 | 45.3 | 38.5 | 1.18 | OK |

TABLE 1-continued

| # | W(um) | T(um) | M(um) | C(um) | C/M | HN(dB) | VN(dB) | HN/VN | Whether or not Cutting Defect Has Occurred |
|---|---|---|---|---|---|---|---|---|---|
| 26 | 1082 | 1161 | 100 | 158 | 1.580 | 44.2 | 37.9 | 1.17 | OK |
| 27 | 1081 | 1179 | 101 | 181 | 1.792 | 43.7 | 38.8 | 1.13 | OK |
| 28* | 1083 | 1201 | 103 | 203 | 1.971 | 41.2 | 39.4 | 1.05 | OK |
| 29* | 1081 | 1218 | 99 | 222 | 2.242 | 39.7 | 39.1 | 1.02 | OK |
| 30* | 1080 | 1251 | 96 | 251 | 2.615 | 38.1 | 39.8 | 0.96 | OK |
| 31* | 1080 | 1304 | 101 | 304 | 3.010 | 37.4 | 40.2 | 0.93 | OK |
| 32 | 1061 | 1121 | 81 | 123 | 1.519 | 45.3 | 37.5 | 1.21 | NG |
| 33 | 1060 | 1139 | 80 | 138 | 1.725 | 44.1 | 38.4 | 1.15 | NG |
| 34* | 1059 | 1161 | 79 | 157 | 1.987 | 42.9 | 39.3 | 1.09 | NG |
| 35* | 1161 | 1178 | 77 | 181 | 2.351 | 42.7 | 39.7 | 1.08 | NG |
| 36* | 1059 | 1202 | 76 | 200 | 2.632 | 41.2 | 39.6 | 1.04 | NG |
| 37* | 1062 | 1221 | 80 | 222 | 2.775 | 39.2 | 39.4 | 0.99 | NG |
| 38* | 1063 | 1251 | 80 | 247 | 3.088 | 38.5 | 40.4 | 0.95 | NG |
| 39* | 1062 | 1301 | 82 | 303 | 3.695 | 37.2 | 40.2 | 0.93 | NG |
| 40* | 1058 | 1352 | 78 | 351 | 4.500 | 36.8 | 40.3 | 0.91 | NG |
| 41 | 1061 | 1398 | 83 | 398 | 4.795 | 35.7 | 40.7 | 0.88 | NG |
| 42 | 1061 | 1451 | 77 | 447 | 5.805 | 34.3 | 40.5 | 0.85 | NG |
| 43 | 1058 | 1502 | 83 | 498 | 6.000 | 32.8 | 41.7 | 0.79 | NG |
| 44 | 1060 | 1547 | 81 | 549 | 6.778 | 31.1 | 41.6 | 0.75 | NG |
| 45 | 1059 | 1603 | 79 | 600 | 7.595 | 29.7 | 42.1 | 0.71 | NG |
| 46 | 1139 | 1103 | 59 | 98 | 1.661 | 43.6 | 37.5 | 1.16 | NG |
| 47* | 1042 | 1121 | 62 | 118 | 1.903 | 41.5 | 38.1 | 1.09 | NG |
| 48* | 1041 | 1128 | 61 | 132 | 2.164 | 40.8 | 38.3 | 1.07 | NG |
| 49* | 1038 | 1157 | 58 | 158 | 2.724 | 40.2 | 38.2 | 1.05 | NG |
| 50* | 1042 | 1176 | 62 | 179 | 2.887 | 39.7 | 38.7 | 1.03 | NG |
| 51* | 1039 | 1203 | 66 | 202 | 3.061 | 38.6 | 39.8 | 0.97 | NG |
| 52* | 1038 | 1152 | 53 | 247 | 4.660 | 37.2 | 40.9 | 0.91 | NG |
| 53 | 1041 | 1301 | 54 | 303 | 5.611 | 35.8 | 41.6 | 0.86 | NG |
| 54 | 1045 | 1351 | 61 | 352 | 5.770 | 35.1 | 42.1 | 0.83 | NG |
| 55 | 1036 | 1400 | 63 | 406 | 6.444 | 34.8 | 42.5 | 0.82 | NG |

It was confirmed from the above Table 1 that in Samples 8, 15 to 22, 28 to 31, 34 to 40, and 47 to 52, in which a range of C/M was 1.826 to 4.686, a ratio (HN/VN) of the acoustic noise value HN in the case in which the multilayer ceramic capacitor is mounted on a board to be parallel with respect thereto, to the acoustic noise value VN in the case in which the multilayer ceramic capacitor is mounted on the board to be perpendicular with respect thereto was in a range of 0.9 to 1.1, relatively small.

Therefore, it may be appreciated that the value of C/M for implementing a uniform level of acoustic noise in the multilayer ceramic capacitor, regardless of whether the multilayer ceramic capacitor is mounted on a board to be parallel or perpendicular with respect thereto satisfies a range of $1.826 \leq C/M \leq 4.686$.

In addition, in a case in which the value of C/M satisfies the range of $1.826 \leq C/M \leq 4.686$, a difference between the width W and the thickness T of the ceramic body is 15% or less.

In addition, the cutting defect is confirmed in Samples 32 to 55 in which the margin M of the ceramic body in the width direction is less than 90 μm.

Therefore, the margin M of the ceramic body in the width direction, capable of preventing the cutting defect of a product, is 90 μm or more.

In addition, it may be appreciated that in Samples 17 to 23, 31, 39 to 45, and 53 to 55 in which the thickness C of the cover layer is excessively increased, a size of a completed chip is excessively large, such that a size standard of the multilayer ceramic capacitor could not be satisfied.

The following Table 2 shows a ratio (Aa/Ac) of a cross-sectional area Aa of an active part in a width-thickness direction, in which the first and second internal electrodes are overlapped with each other in a thickness direction, to a cross-sectional area Ac of the ceramic body in the width-thickness direction.

The ratio Aa/Ac of the cross-sectional areas are obtained by measuring the cross-sectional areas from an image obtained by photographing a cross-section of the multilayer ceramic capacitor cut in the thickness direction at a central portion of the ceramic body in a width direction in the multilayer ceramic capacitor, using a scanning electron microscope (SEM).

TABLE 2

| # | Aa/Ac (%) | Capacitance Implementation Rate (%) | Withstanding Voltage (V) | Horizontal Mounting | Vertical Mounting | HN/VN |
|---|---|---|---|---|---|---|
| 1 | 62.05 | 283% | 110 | 48.3 | 39.4 | 1.23 |
| 2 | 56.54 | 256% | 112 | 46.1 | 38.6 | 1.19 |
| 3 | 50.99 | 228% | 108 | 41.9 | 36.9 | 1.14 |
| 4 | 49.11 | 223% | 114 | 37.7 | 36.1 | 1.04 |
| 5 | 48.04 | 220% | 112 | 36.8 | 35.8 | 1.03 |
| 6 | 45.87 | 214% | 116 | 36.5 | 34.7 | 1.05 |
| 7 | 42.03 | 195% | 116 | 35.8 | 33.4 | 1.07 |
| 8 | 27.18 | 122% | 109 | 33.6 | 32.3 | 1.04 |
| 9 | 22.15 | 108% | 110 | 32.8 | 31.8 | 1.03 |
| 10 | 21.42 | 101% | 107 | 31.2 | 30.7 | 1.02 |
| 11 | 19.17 | 87% | 116 | 29.6 | 30.5 | 0.97 |
| 12 | 18.26 | 81% | 115 | 27.4 | 29.1 | 0.94 |

It is confirmed from the above Table 2 that in all Samples, withstanding voltages are substantially similar to each other, and in Samples 4 to 10 in which a range of Aa/Ac is 0.2142 to 0.4911, a capacitance implementation rate is 100% or more and acoustic noises in horizontal mounting and vertical mounting schemes are similar to each other.

In Samples 11 and 12 in which the value of Aa/Ac is less than 0.2142, a capacitance implementation rate is less than 100%, problematic, and in Samples 1 to 3 in which the value of Aa/Ac exceeds 0.4911, a ratio of differences in acoustic noises in the horizontal mounting and vertical mounting schemes exceeded 1.1, problematic.

Meanwhile, since a capacitance of the multilayer ceramic capacitor is in inverse proportion to an interval between the internal electrodes, the capacitance may be increased through a decrease in a thickness of the dielectric layer.

In addition, since withstanding voltage characteristics of the multilayer ceramic capacitor satisfy an equation (E=V/d) of an electric field E generated in a case in which a potential difference is applied between the internal electrodes, they may be increased as the interval between the internal electrodes is decreased.

Further, since a breakdown is generated when an electric field greater than dielectric strength, an intrinsic physical property, of a material is applied, in a case in which the same potential is applied to the multilayer ceramic capacitor when the thickness of the dielectric layer is decreased, strength of the applied electric field may be increased, such that the withstanding voltage characteristics of the multilayer ceramic capacitor may be deteriorated.

That is, in a case in which a deterioration phenomenon generated when the thickness of the dielectric layer is decreased in order to implement the same capacitance may be controlled, a capacitance density may be further increased.

Figure 7:
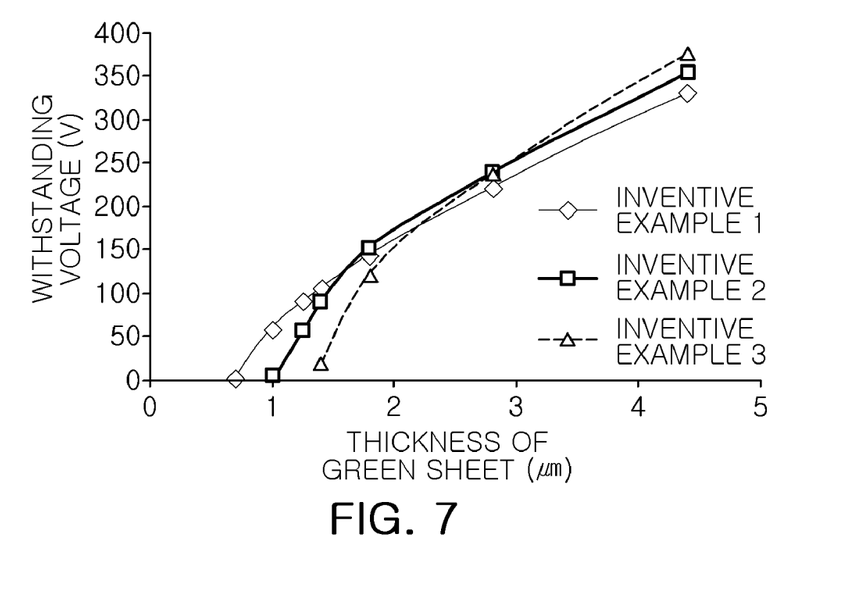
FIG. 7 is a graph showing changes in withstanding voltage characteristics depending on changes in an average particle size of a barium titanate (BT) powder before being sintered and a thickness of a ceramic green sheet.

FIG. 7 is a graph showing changes in withstanding voltage characteristics depending on changes in an average particle size of a barium titanate (BT) powder before being sintered and a thickness of a ceramic green sheet.

In the exemplary embodiment, BT powder of 120 to 300 nm level may be used.

BT powder of 120 nm was used in Inventive Example 1, BT powder of 180 nm was used in Inventive Example 2, and BT powder of 300 nm was used in Inventive Example 3.

As shown in FIG. 7, in a region in which a thickness of the ceramic green sheet is 3 μm or more, the most excellent withstanding voltage characteristics are implemented in Inventive Example 3 in which the BT powder of 300 nm is used.

In addition, in a region in which the thickness of the ceramic green sheet is 1.5 to 3 μm, the most excellent withstanding voltage characteristics are implemented in Inventive Example 2 in which the BT powder of 180 nm is used.

In a region in which the thickness of the ceramic green sheet was 1.5 μm or less, the most excellent withstanding voltage characteristics are implemented in Inventive Example 1 in which the BT powder of 120 nm is used.

That is, an optimal particle size of the BT powder for implementing optimal withstanding voltage characteristics is used depending on the thickness of the ceramic green sheet When the particle size of the BT powder is decreased, a rapid deterioration in withstanding voltage characteristics occurs in the case of using the ceramic green sheet having a reduced thickness.

In a case in which the BT powder having a small particle size is used, an increased amount of organic materials needs to be used as compared to BT powder having a large particle size in order to implement dispersibility and film characteristics. Therefore, a further increased amount of organic materials may be required in order to implement physical properties of a uniform green sheet.

In addition, the BT powder having a small particle size may be advantageous for implementing surface roughness of the ceramic green sheet, and uniformity of the ceramic green sheet is increased after the BT powder was sintered, such that the same average thickness may be implemented while a minimum thickness may be further increased, and withstanding voltage characteristics may be implemented.

The particles of the BT powder may be prepared by, for example, a hydrothermal synthesis method.

In the hydrothermal synthesis method, the BT powder may be prepared by the following processes. Barium hydroxide octahydrate $(Ba(OH)_2 8H_2O)$ and about 1 mol % of tetrahydroxy silane based on barium hydroxide are introduced in a reactor, and the reactor is purged with nitrogen. Then, the mixture is stirred at 100° C. or more to thereby be dissolved, and titanium oxide $(TiO_2)$ sol is heated to about 60° C. or more. Thereafter, the barium (Ba) solution and the titanium oxide $(TiO_2)$ sol are rapidly put together and mixed with each other, a reaction operation is performed for 10 minutes by rapidly stirring the mixture at a temperature of 110° C. and 300 rpm or more to completely convert raw materials into barium titanate, thereby terminating seed formation. Then, a concentration of a mixed solution is lowered and pH thereof is also lowered to 11.5 by adding pure water in the mixed solution. After making a temperature to be increased to 250° C., and particle growth of barium titanate is performed for 20 hours, thereby preparing the BT powder.

The following Table 3 shows capacitance implementation rates and withstanding voltage characteristics of the multilayer ceramic capacitor measured after the thickness of the dielectric layer is adjusted.

TABLE 3

| # | Thickness (μm) of Dielectric layer | Number of Stacked Layers | Capacitance implementation rate (%) | Withstanding Voltage (V) |
|---|---|---|---|---|
| 1 | 0.448 | 590 | 752% | 5 |
| 2 | 0.640 | 520 | 455% | 60 |
| 3 | 0.800 | 475 | 328% | 85 |
| 4 | 0.901 | 450 | 281% | 112 |
| 5 | 1.152 | 395 | 192% | 144 |
| 6 | 1.792 | 307 | 96% | 224 |
| 7 | 2.816 | 225 | 45% | 332 |

It could be confirmed from the above Table 3 that when the thickness of the dielectric layer is decreased, the withstanding voltage is decreased and the capacitance is increased.

In addition, it could be confirmed that in Sample 1 in which the thickness of the dielectric layer is decreased to 0.5 μm or less, the withstanding voltage characteristics are rapidly deteriorated.

The thickness of the ceramic green sheet in which the withstanding voltage characteristics are rapidly deteriorated may be reduced as the particle size of the BT powder is decreased.

Referring to Table 3, in Samples 4 to 7 in which the thickness of the dielectric layer was 0.9 μm or more, even though the number of stacked dielectric layers is less than 500, the withstanding voltage is 100V or more.

However, in Samples 6 and 7 in which the thickness of the dielectric layer exceeds 1.75 μm, the capacitance implementation rate is lower than 100%.

Therefore, it could be confirmed that the thickness of the dielectric layer simultaneously satisfying the withstanding voltage and the capacitance implementation rate characteristics is 0.9 to 1.75 μm.

As set forth above, according to exemplary embodiments of the present disclosure, a difference between the acoustic noise generated in a case in which the multilayer ceramic capacitor is mounted on a board to be parallel thereto and the acoustic noise generated in a case in which the multilayer ceramic capacitor is mounted on the board to be perpendicular thereto may be significantly decreased, such that it may be unnecessary to determine the mounting direction in which a chip is mounted with respect to the board.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body having a plurality of dielectric layers stacked therein;
an active part including a plurality of first and second internal electrodes alternately exposed through end surfaces of the ceramic body, respectively, each of the dielectric layers being interposed between the plurality of first and second electrodes;
upper and lower cover layers disposed on upper and lower surfaces of the active part, respectively; and
first and second external electrodes covering side surfaces of the ceramic body, respectively,
wherein when a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

2. The multilayer ceramic capacitor of claim 1, wherein multilayer ceramic capacitor has a capacitance of 10 μF or more.

3. The multilayer ceramic capacitor of claim 1, wherein a difference between a width and a thickness of the ceramic body is 15% or less.

4. The multilayer ceramic capacitor of claim 1, wherein a thickness of the dielectric layer is 0.9 to 1.75 μm.

5. The multilayer ceramic capacitor of claim 1, wherein the margin between the active part and the side surface of ceramic body in the width direction is 90 μm or more.

6. A board comprising:
a substrate;
first and second electrode pads disposed on the substrate; and
a multilayer ceramic capacitor mounted on the first and second electrode pads,
the multilayer ceramic capacitor including:
a ceramic body having a plurality of dielectric layers stacked therein;
an active part including a plurality of first and second internal electrodes alternately exposed through end surfaces of the ceramic body respectively, each of the dielectric layers being interposed between the plurality of first and second internal electrodes, the plurality of first and second internal electrodes being disposed to be parallel with respect to a mounting surface of the substrate on which the ceramic body is disposed;
upper and lower cover layers disposed on upper and lower surfaces of the active part respectively; and
first and second external electrodes covering the end surfaces of the ceramic body respectively,
when a thickness of the upper or lower cover layer is defined as C, a margin of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

7. The board of claim 6, wherein the multilayer ceramic capacitor has a capacitance of 10 μF or more.

8. The board of claim 6, wherein a difference in distances of a width and a thickness of the ceramic body is 15% or less.

9. The board of claim 6, wherein a thickness of the dielectric layer is 0.9 to 1.75 μm.

10. The board of claim 6, wherein the margin of ceramic body in the width direction is 90 μm or more.

11. A board comprising:
a substrate;
first and second electrode pads disposed on the substrate; and
a multilayer ceramic capacitor mounted on the first and second electrode pads,
the multilayer ceramic capacitor including:
a ceramic body having a plurality of dielectric layers stacked therein;
an active part including a plurality of first and second internal electrodes alternately exposed through both end surfaces of the ceramic body respectively, each of the dielectric layers being interposed between the plurality of first and second electrodes, the plurality of first and second electrodes being disposed to be perpendicular with respect to a mounting surface of the substrate on which the ceramic is mounted;
upper and lower cover layers disposed on upper and lower surfaces of the active part respectively; and
first and second external electrodes covering the side surfaces of the ceramic body respectively,
wherein when a thickness of the upper or lower cover layer is defined as C, a margin between the active part and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

12. The board of claim 11, wherein the multilayer ceramic capacitor has a capacitance of 10 μF or more.

13. The board of claim 11, wherein a difference in distances of a width and a thickness of the ceramic body is 15% or less.

14. The board of claim 11, wherein a thickness of the dielectric layer is 0.9 to 1.75 μm.

15. The board of claim 11, wherein the margin of ceramic body in the width direction is 90 μm or more.

16. A method for manufacturing a ceramic body comprising:
preparing a plurality of ceramic green sheets;
applying a conductive paste to the plurality of ceramic green sheets to form a plurality of first and second internal electrodes;
stacking the plurality of the green sheets to dispose the first and second internal electrodes alternately to form a multilayer ceramic body; and
forming an upper cover layer and an lower cover layer on the upper surface and the lower surface of the multilayer ceramic body respectively, such that when a thickness of the upper or lower cover layer is defined as C, a margin between the plurality of first and second internal electrodes and a side surface of the ceramic body in a width direction is defined as M, a cross-sectional area of the ceramic body in a width-thickness direction is defined as Ac, and a cross-sectional area of the active part in the width-thickness direction, in which the first and second internal electrodes are overlapped with each other in a thickness direction, is defined as Aa, $1.826 \leq C/M \leq 4.686$, and $0.2142 \leq Aa/Ac \leq 0.4911$.

17. The method of claim 16, further comprising:
performing an isostatic pressing on the multilayer ceramic body under pressure conditions of 1,000 kg·f/cm² at a temperature of about 85° C.

18. The method of claim 17, further comprising:
cutting the multilayer ceramic body into individual chips;
keeping the individual chips at a temperature of 230° C. for about 60 hours under an air atmosphere; and
subjecting the individual chips to a debinder process.

19. The method of claim 18, further comprising:
sintering the chips at a temperature of about 1200° C. under a reducing atmosphere having oxygen partial pressure of $10^{-11}$ to $10^{-10}$ atm lower than a Ni/NiO balanced oxygen partial pressure such a that the first and second internal electrodes were not oxidized.

* * * * *